(12) United States Patent
Takada et al.

(10) Patent No.: US 8,809,908 B2
(45) Date of Patent: Aug. 19, 2014

(54) SEMICONDUCTOR WAFER, SEMICONDUCTOR WAFER MANUFACTURING METHOD, AND ELECTRONIC DEVICE

(75) Inventors: Tomoyuki Takada, Tsukuba (JP); Sadanori Yamanaka, Tsukuba (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 487 days.

(21) Appl. No.: 12/811,038

(22) PCT Filed: Dec. 26, 2008

(86) PCT No.: PCT/JP2008/004038
§ 371 (c)(1),
(2), (4) Date: Oct. 4, 2010

(87) PCT Pub. No.: WO2009/084239
PCT Pub. Date: Jul. 9, 2009

(65) Prior Publication Data
US 2011/0037099 A1     Feb. 17, 2011

(30) Foreign Application Priority Data
Dec. 28, 2007  (JP) ................................ 2007-341295

(51) Int. Cl.
*H01L 21/20*  (2006.01)

(52) U.S. Cl.
USPC .................................. 257/190; 257/E21.124

(58) Field of Classification Search
USPC ........................ 257/190, E21.124, E21.123
See application file for complete search history.

(56) References Cited

U.S. PATENT DOCUMENTS 4,614,564 A     9/1986  Sheldon et al.
6,673,646 B2 *  1/2004  Droopad ........................ 438/85

FOREIGN PATENT DOCUMENTS

JP     60-210831 A    10/1985
JP     61-094318 A     5/1986

(Continued)

OTHER PUBLICATIONS

W.E. McMahon et al., "An STM and LEED study of MOCVD-prepared P/Ge (100) to (111) surfaces", Surface Sciences, 2004, pp. 146-156, vol. 571, Nos. 1-3.
Lutz Kipp et al., "Phosphine adsorption and decomposition on Si(100) 2×1 studied by STM", Physical Review B, Aug. 15, 1995, pp. 5843-5850, vol. 52, No. 8.

(Continued)

*Primary Examiner* — Colleen Matthews
*Assistant Examiner* — Lauren R. Bell
(74) *Attorney, Agent, or Firm* — Sughrue Mion, PLLC

(57) ABSTRACT

A high-quality GaAs-type crystal thin film using an inexpensive Si wafer with good thermal release characteristics is achieved. Provided is a semiconductor wafer comprising an Si wafer; a Ge layer that is crystal-grown on the wafer and shaped as an isolated island; a buffer layer that is crystal-grown on the Ge layer and is a group 3-5 compound semiconductor layer containing P; and a functional layer that is crystal-grown on the buffer layer. The Ge layer may be shaped as an island having a size that does not exceed double a distance moved by crystal defects as a result of annealing the Ge layer at a certain temperature for a certain time. The Ge layer may be shaped as an island having a size for which stress due to a difference relative to a thermal expansion coefficient of Si, which is material of the wafer, does not cause crystal defects when the Ge layer is annealed at a certain temperature.

45 Claims, 24 Drawing Sheets

(56) References Cited

FOREIGN PATENT DOCUMENTS

| JP | 61-135115 A | 6/1986 |
| JP | 8-316152 A | 11/1996 |
| JP | 2000-012467 A | 1/2000 |
| JP | 2005-019472 A | 1/2005 |
| WO | 2005/084231 A2 | 9/2005 |

OTHER PUBLICATIONS

Hsin-Chiao Luan et al., "High-quality epilayers on Si with low threading-dislocation densities" Applied Physical Letters, Nov. 8, 1995, pp. 2909-2911, vol. 75, No. 19.

Office Action issued Jul. 16, 2013 in counterpart Japanese Application No. 2008-335028 with English translation.

Office Action issued Mar. 11, 2014 in Taiwanese Patent Application No. 097151177 with English translation.

* cited by examiner

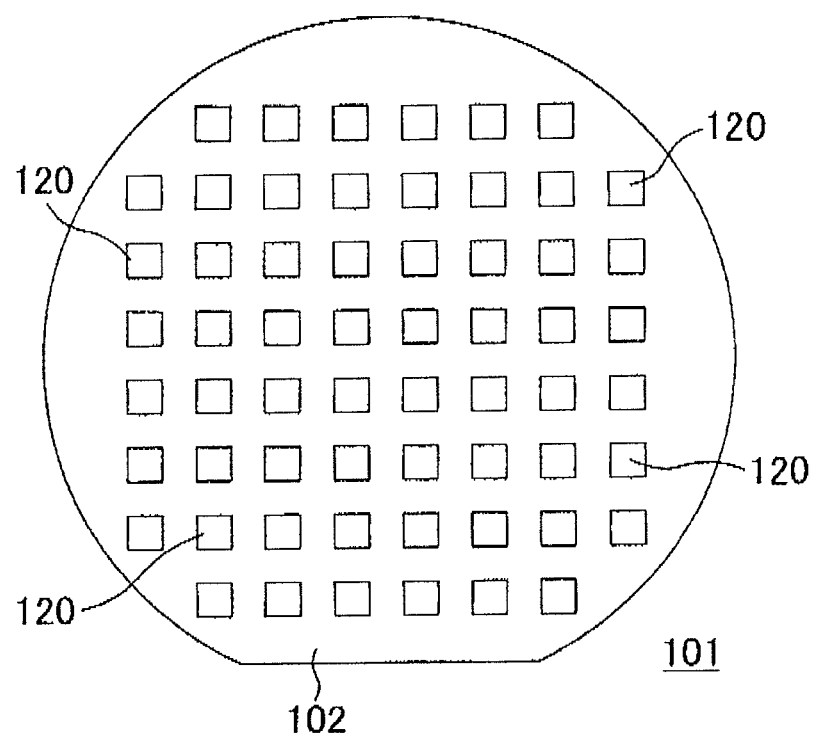
F I G . 1

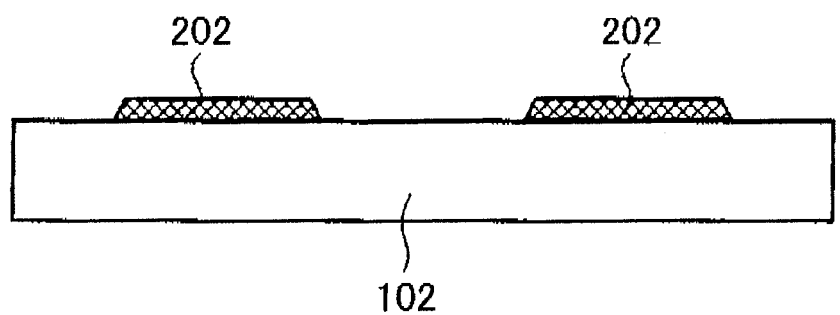
F I G . 10

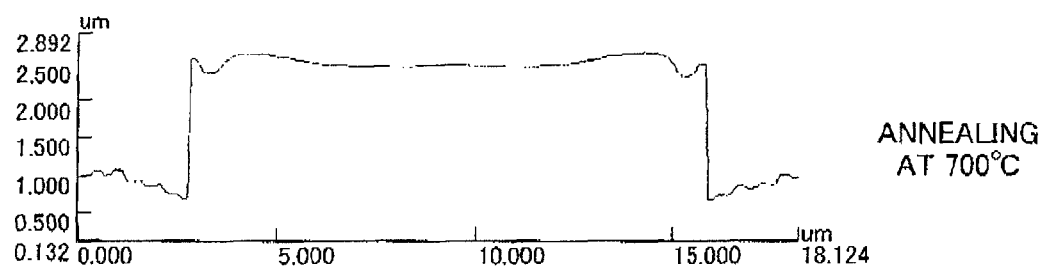
F I G . 14

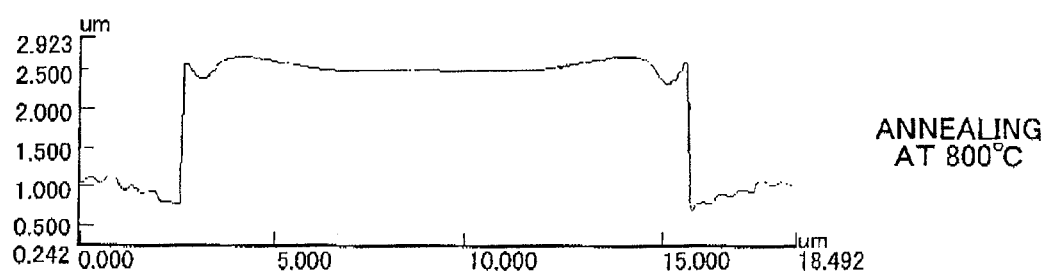
F I G . 15

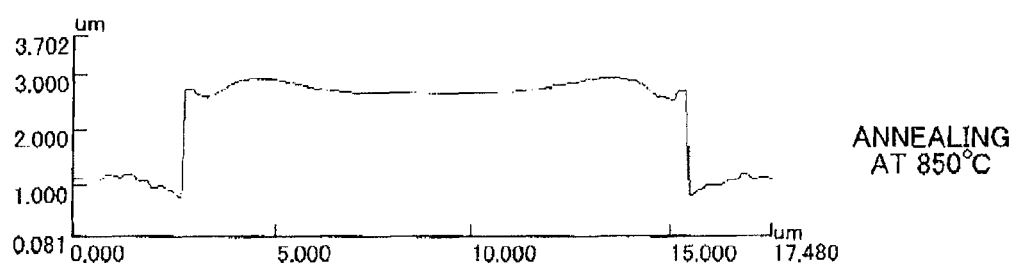
F I G . 16

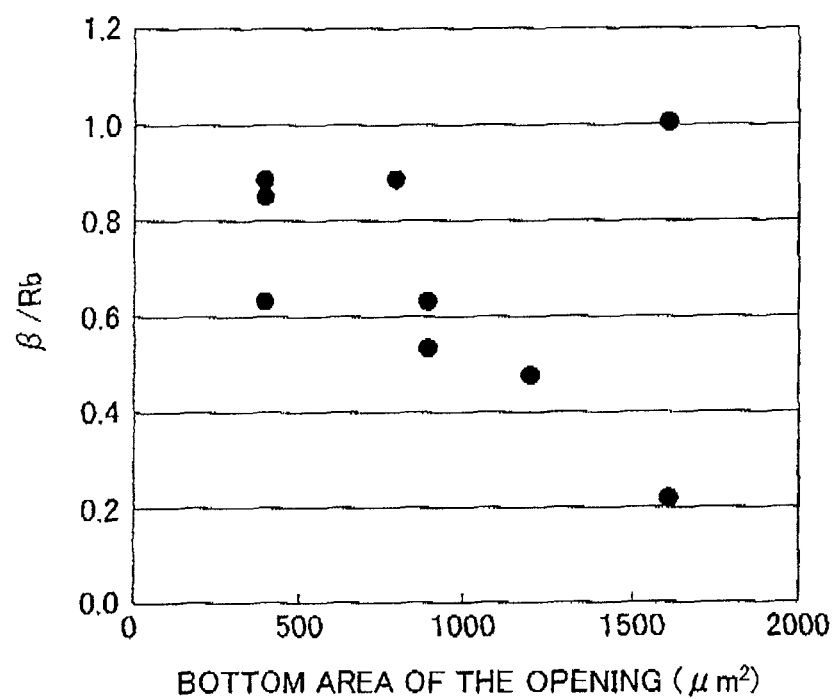
F I G. 22

SEMICONDUCTOR WAFER, SEMICONDUCTOR WAFER MANUFACTURING METHOD, AND ELECTRONIC DEVICE

TECHNICAL FIELD

The present invention relates to a semiconductor wafer, a method of manufacturing a semiconductor wafer, and an electronic device. In particular, the present invention relates to a semiconductor wafer, a method of manufacturing a semiconductor wafer, and an electronic device including a crystal thin film having good crystallinity formed on an inexpensive silicon wafer.

BACKGROUND ART

Various types of high-performance electronic devices are being developed that use heterojunctions in semiconductor devices therein made of compounds such as GaAs. Since the characteristics of these high-performance electronic devices are influenced by the quality of crystallinity, high quality crystal thin films are desired. The need for lattice matching at the heterointerfaces in thin film crystal growth of GaAs-based devices leads to the selection of wafers made of GaAs or of materials such as Ge whose lattice constant is very close to that of GaAs.

Non-Patent Document 1 discloses a technique for forming a high quality Ge epitaxial growth layer (sometimes referred to hereinafter as a "Ge epilayer") on an Si wafer. With this technique, the Ge epilayer is formed in a limited region on the Si wafer, and cyclic thermal annealing is then performed on the Ge epilayer to achieve an average dislocation density of $2.3 \times 10^6$ cm$^{-2}$.

Non-Patent Document 1: Hsin-Chiao Luan et. al., "High-quality Ge Epilayers on Si with Low Threading-dislocation Densities" APPLIED PHYSICS LETTERS, Volume 75, No. 19, Nov. 8, 1999.

DISCLOSURE OF THE INVENTION

Problems to be Solved by the Invention

When manufacturing GaAs-type electronic devices, lattice matching is considered and a GaAs wafer or a wafer that can achieve lattice matching with GaAs, such as a Ge wafer, is selected, as described above. However, GaAs wafers or wafers such as Ge wafers that can achieve lattice matching with GaAs are expensive, and this increases the overall cost of the device. Furthermore, these wafers do not have sufficient heat dissipation characteristics, and this might result in limitations such as restrictions on the formation density of the devices in order to achieve a reliable thermal design or only using the devices in a temperature range for which thermal release can be achieved. Accordingly, there is a demand for a semiconductor wafer that can be manufactured using an inexpensive Si wafer with good thermal release characteristics and that has a high-quality GaAs-type crystal thin film.

Means for Solving the Problems

To solve the above problems, according to a first aspect of the invention, provided is a semiconductor wafer comprising an Si wafer; a Ge layer that is crystal-grown on the wafer and shaped as an isolated island; a buffer layer that is crystal-grown on the Ge layer and is a group 3-5 compound semiconductor layer containing P; and a functional layer that is crystal-grown on the buffer layer. According to a second aspect of the invention, provided is a semiconductor wafer comprising an Si wafer; a buffer layer that is a GaAs layer crystal-grown on the wafer at a temperature no greater than 500° C., and shaped as an isolated island; and a functional layer that is crystal-grown on the buffer layer. According to a second aspect of the invention, provided is a semiconductor wafer comprising an Si wafer; and a functional layer that is crystal-grown on the wafer and shaped as an isolated island, wherein a top surface of the wafer is surface processed with a gas containing P.

In the first aspect, the Ge layer may be shaped as an island having a size that does not exceed double a distance moved by crystal defects as a result of annealing the Ge layer at a certain temperature for a certain time. The Ge layer may be shaped as an island having a size for which stress due to a difference relative to a thermal expansion coefficient of Si, which is material of the wafer, does not cause crystal defects when the Ge layer is annealed at a certain temperature. The Ge layer may be shaped as an island with an area no greater than 1 mm$^2$. The Ge layer may be annealed with a temperature and duration that enables crystal defects to move, and the annealing may be repeated a plurality of times. The functional layer may be a group 3-5 compound layer or a group 2-b compound layer that lattice matches or pseudo-lattice matches with Ge. For example, the functional layer may be a group 3-5 compound layer that lattice matches or pseudo-lattice matches with Ge, in which a group 3 element includes at least one of Al, Ga, and In and a group 5 element includes at feast one of N, P, As, and Sb.

According to a second aspect of the invention, provided is a semiconductor wafer comprising an Si wafer; a plurality of Ge layers formed on the wafer and separated from each other; buffer layers formed on the Ge layers; and functional layers formed on the buffer layers.

In the above semiconductor wafer, the buffer layers may lattice match or pseudo-lattice match with the Ge layers, and the functional layers may lattice match or pseudo-lattice match with the buffer layers. The buffer layers may be group 3-5 compound semiconductor layers containing P. The Ge layers may be annealed in an atmosphere containing hydrogen. A surface of each Ge layer facing a functional layer is surface processed with a gas containing P.

In the above semiconductor wafer, area of a top surface of each Ge layer may be no greater than 1 mm$^2$. The area of the top surface of each Ge layer may be no greater than 1600 μm$^2$. The area of the top surface of each Ge layer may be no greater than 900 μm$^2$. The top surface of each Ge layer may be shaped as a rectangle, and a long side of the rectangle may be no greater than 80 μm. The top surface of each Ge layer may be shaped as a rectangle, and a long side of the rectangle may be no greater than 40 μm.

In the above semiconductor wafer, the principal surface of the wafer may be a (100) surface, a bottom of the opening may be shaped as a square or a rectangle, and at least one side of the square or the rectangle may be substantially parallel to a direction selected from a group including a <010> direction, a <0-10> direction, a <001> direction, and a <00-1> direction on the principal surface. The principal surface of the wafer may be a (111) surface, a bottom of the opening may be shaped as a hexagon, and at least one side of the hexagon may be substantially parallel to a direction selected from a group including a <1-10> direction, a <-110> direction, a <0-11> direction, a <01-1> direction, a <10-1> direction, and a <-101> direction on the principal surface. In the Miller index used to indicate a direction or a surface of a crystal, negative integers are usually represented by a bar over the number.

However, in this Specification, negative integers are represented by a minus sign, for ease of explanation. For example, a surface that crosses values of 1, −2, and 3 respectively on an a-axis, a b-axis, and a c-axis in a unit cell is described as a (1-23) surface. Miller indices for directions are represented in the same way.

According to a third aspect of the invention, provided is a semiconductor wafer comprising an Si wafer; a plurality of buffer layers that are formed separated from each other on the wafer, and that each include a GaAs layer; and functional layers formed on the buffer layers. The functional layers may lattice match or pseudo-lattice match with the buffer layers. The GaAs layers may be crystal-grown at a temperature no greater than 600° C.

According to a fourth aspect of the invention, provided is a semiconductor wafer comprising an Si wafer; and a plurality of functional layers that are formed separated from each other on the wafer, wherein before formation of the functional layers, a top surface of the wafer is surface processed with a gas containing P. The functional layers may be group 3-5 compound layers or group 2-6 compound layers. Each functional layer is a group 3-5 compound layer that includes at least one element selected from a group including Al, Ga, and In as a group 3 element and includes at least one element selected from a group including N, P, As, and Sb as a group 5 element. Arithmetic mean roughness of each functional layer may be no greater than 0.02 μm.

According to a fifth aspect of the invention, provided is a method of manufacturing a semiconductor wafer comprising crystal-growing a Ge layer on an Si wafer; patterning the Ge layer to shape the Ge layer as an isolated island; crystal-growing, on the Ge layer, a buffer layer that is a group 3-5 compound semiconductor layer containing P; and crystal-growing a functional layer on the buffer layer. The method of manufacturing a semiconductor wafer may further comprise annealing the island-shaped Ge layer with a temperature and duration that enables crystal defects to move, and the annealing may be performed a plurality of times.

According to a sixth aspect of the invention, provided is a method of manufacturing a semiconductor wafer comprising forming a plurality of Ge layers that are separated from each other on an Si wafer; forming buffer layers on the Ge layers; and forming functional layers on the buffer layers. Forming the buffer layers may include lattice matching or pseudo-lattice matching the buffer layers with the Ge layers, and forming the functional layers may include lattice matching or pseudo-lattice matching the functional layers with the buffer layers. Forming the buffer layers may include forming group 3-5 compound semiconductor layers containing P. The method of manufacturing a semiconductor wafer may further comprise annealing the Ge layers with a temperature and duration that enables crystal defects to move. The annealing may include annealing the Ge layers at a temperature that is greater than or equal to 680° C. and less than 900° C. The annealing may include annealing the Ge layers in an atmosphere containing hydrogen. The annealing may be performed a plurality of times.

According to a seventh aspect of the invention, provided is a method of manufacturing a semiconductor wafer comprising forming, on an Si wafer, a plurality of buffer layers that are separated from each other and that each include a GaAs layer; and forming functional layers on the buffer layers. The GaAs layers may be crystal-grown at a temperature no greater than 600° C. According to an eighth aspect of the invention, provided is a method of manufacturing a semiconductor wafer comprising surface processing a top surface of an Si wafer with a gas containing P; and forming on the wafer a plurality of functional layers that are separated from each other.

In the above method of manufacturing a semiconductor wafer, each functional layer may be a group 3-5 compound layer that includes at least one element selected from a group including Al, Ga, and In as a group 3 element and includes at least one element selected from a group including N, P, As, and Sb as a group 5 element, and forming the functional layers may include crystal-growing the functional layers at a growth rate no less than 1 nm/min and no greater than 300 nm/min.

According to a ninth aspect of the invention, provided is an electronic device comprising an Si wafer; a Ge layer that is crystal-grown on the wafer and shaped as an isolated island; a buffer layer that is crystal-grown on the Ge layer and is a group 3-5 compound semiconductor layer containing P; a functional layer that is crystal-grown on the buffer layer; and an electronic element formed on the functional layer. The electronic element may be a heterojunction bipolar transistor, and one electronic element may be formed on each island-shaped Ge layer. The electronic elements may be connected to each other, or may be connected in parallel. A plurality of the island-shaped Ge layers may be formed at uniform intervals on the wafer.

According to a tenth aspect, provided is an electronic device comprising an Si wafer; a plurality of Ge layers formed on the wafer and separated from each other; buffer layers formed on the Ge layers; functional layers formed on the buffer layers; and electronic elements formed on the functional layers. The buffer layers may lattice match or pseudo-lattice match with the Ge layers; and the functional layers may lattice match or pseudo-lattice match with the buffer layers. The buffer layers may be group 3-5 compound semiconductor layers containing P. One electronic element is formed on each Ge layer. The Ge layers may be arranged at uniform intervals.

According to an eleventh aspect of the invention, provided is an electronic device comprising an Si wafer; a plurality of buffer layers that are formed separated from each other on the wafer, and that each include a GaAs layer; functional layers formed on the buffer layers; and electronic elements formed on the functional layers. The functional layers may lattice match or pseudo-lattice match with the buffer layers. The GaAs layers may be crystal-grown at a temperature no greater than 600° C. One electronic element may be formed on each buffer layer. The buffer layers may be arranged at uniform intervals.

According to a twelfth aspect of the invention, provided is an electronic device comprising an Si wafer; a plurality of functional layers that are formed separated from each other on the wafer; and electronic elements formed on the functional layers, wherein before formation of the functional layers, a top surface of the wafer is surface processed with a gas containing P. One electronic element may be formed on each functional layer. The functional layers may be arranged at uniform intervals.

In the above electronic device, the electronic elements may be heterojunction bipolar transistors. The electronic elements are connected to each other. The electronic elements are connected in parallel.

BRIEF DESCRIPTION OF THE DRAWINGS

FIG. 1 is an exemplary planar view of a semiconductor wafer 101 according to an embodiment of the present invention.

FIG. 10 is an exemplary cross-sectional view of a step for manufacturing the semiconductor wafer 201.

FIG. 14 shows the cross-sectional shape of the Ge layer that is annealed at 700° C.

FIG. 15 shows the cross-sectional shape of the Ge layer that is annealed at 800° C.

FIG. 16 shows the cross-sectional shape of the Ge layer that is annealed at 850° C.

FIG. 22 shows a relationship between the electrical characteristics of HBT elements and the area of the top surface of the Ge layers.

LIST OF REFERENCE NUMERALS

Figure 2:
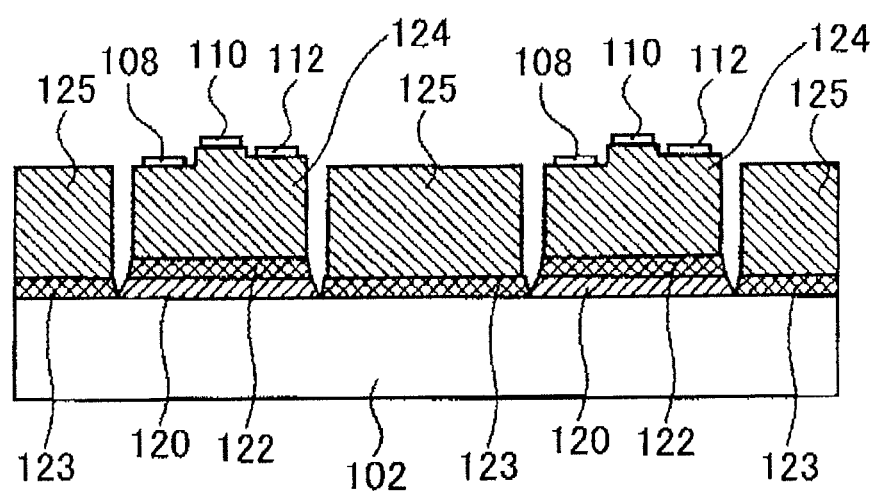
FIG. 2 is a cross-sectional view of the semiconductor wafer 101 together with HBTs formed on the island-shaped Ge layers 120.

| | |
|---|---|
| 101 | Semiconductor wafer |
| 102 | Si wafer |
| 108 | Collector electrode |
| 110 | Emitter electrode |
| 112 | Base electrode |
| 120 | Ge layer |
| 122 | Buffer layer |
| 123 | InGaP layer |
| 124 | Element formation layer |
| 125 | Annexing layer |
| 130 | Ge film |

-continued

LIST OF REFERENCE NUMERALS

| | |
|---|---|
| 201 | Semiconductor wafer |
| 202 | Buffer layer |
| 204 | GaAs film |
| 301 | Semiconductor wafer |

BEST MODE FOR CARRYING OUT TILE INVENTION

Hereinafter, some embodiments of the present invention will be described. The embodiments do not limit the invention according to the claims, and all the combinations of the features described in the embodiments are not necessarily essential to means provided by aspects of the invention. FIG. 1 is an exemplary planar view of a semiconductor wafer 101 according to an embodiment of the present invention. The semiconductor wafer 101 of the present invention includes island-shaped Ge layers 120 on an Si wafer 102. Each island-shaped Ge layer 120 serves as an element formation region on which an element is formed. As shown in FIG. 1, a plurality of the island-shaped Ge layers 120 are formed at uniform intervals on a top surface of the Si wafer 102.

In the semiconductor wafer 101 of the present embodiment, HBTs (hetero junction bipolar transistors) are formed as examples of electronic elements on the island-shaped Ge layers 120 shown in FIG. 1. One electronic element, exemplified here by an HBT, may be formed on each island-shaped Ge layer 120. The electronic elements may be connected to each other, or may be connected in parallel.

The Si wafer 102 is an example of an Si wafer. The Si wafer 102 may be a commercial Si wafer.

The Si wafer 102 may be a high-resistance wafer that does not include impurities, or may be a low-resistance wafer or mid-resistance wafer that includes positive or negative impurities. The Ge layer 120 may be Ge that does not include impurities, or may be Ge that includes positive or negative impurities. The top surface of the Si wafer 102 is an example of a principal surface of the wafer.

FIG. 2 is a cross-sectional view of the semiconductor wafer 101 together with HBTs formed on the island-shaped Ge layers 120. The semiconductor wafer 101 includes the Si wafer 102, the Ge layers 120, buffer layers 122, and the element formation layers 124. The HBTs are formed as electronic elements on the element formation layers 124. In the present embodiment, an HBT is provided as an example of an electronic element formed on an element formation layer 124, but the electronic element is not limited to this. For example, other electronic elements such as a light emitting diode, an HEMT (High Electron Mobility Transistor), a solar battery, and a thin film sensor may be formed.

A collector mesa, an emitter mesa, and a base mesa of the HBT are formed on the top surface of each element formation layer 124. The collector electrode 108, the emitter electrode 110, and the base electrode 112 are formed on the top surfaces of the collector mesa, the emitter mesa, and the base mesa via contact holes. A collector layer, an emitter layer, and a base layer of an HBT are included in each element formation layer 124.

One example of the collector layer is a layered thin film obtained by layering, in the stated order from the wafer, an $n^+$GaAs layer with a carrier concentration of $3.0 \times 10^{18}$ cm$^{-3}$ and a thickness of 500 nm and an $n^-$GaAs layer with a carrier concentration of $1.0 \times 10^{16}$ cm$^{-3}$ and a thickness of 500 nm.

One example of the base layer is a p⁻GaAs layer with a carrier concentration of $5.0 \times 10^{19}$ cm⁻³ and a thickness of 50 nm. One example or the emitter layer is a layered thin film obtained by layering, in the stated order from the wafer, an n⁻InGaP layer with a carrier concentration of $3.0 \times 10^{17}$ cm⁻³ and a thickness of 30 nm, an n⁺GaAs layer with a carrier concentration of $3 \times 10^{18}$ cm⁻³ and a thickness of 100 nm, and an n¹InGaAs layer with a carrier concentration of $1.0 \times 10^{19}$ cm⁻³ and a thickness of 100 nm.

The Si wafer 102 may be as described above. The Ge layers 120 are formed as independent islands on the Si wafer 102. The Ge layers 120 are crystal-grown on the Si wafer 102. One example of crystal growth is epitaxial growth. The Ge layers 120 are shaped as islands that each have a size no greater than double the distance that crystal defects move during annealing with a certain temperature and duration.

The Ge layers 120 may be shaped as islands that each have a size for which stress due to a difference relative to a thermal expansion coefficient of the Si wafer 102 does not cause crystal defects when the Ge layer is annealed at a certain temperature. The Ge layers 120 can be formed such that the area of one island-shaped Ge layer 120 is no greater than 1 mm², preferably less than 0.25 mm². The Ge layers 120 can be annealed with a temperature and duration that enables movement of crystal defects, and the annealing can be repeated multiple times.

When a plurality of Ge layers 120 are formed on the Si wafer 102, the Ge layers 120 may be separated from each other on the Si wafer 102. The Ge layers 120 may be arranged at uniform intervals. In the present Specification, the "top surface" of a Ge layer 120 refers to the surface that is on the opposite side of the surface facing the water. For example, when a Ge layer 120 contacts the surface of the Si wafer 102, the surface of the Ge layer 120 that contacts the Si wafer 102 is referred to as the "bottom surface" and the surface that is opposite the bottom surface is referred to as the "top surface." Furthermore, the shape of the top surface of a Ge layer 120 is sometimes referred to as the "top shape."

The area of the top surface of each Ge layer 120 may be no greater than 1 mm², preferably less than 0.25 mm². This area may be no greater than 0.01 mm², is preferably no greater than 1600 μm², and more preferably no greater than 900 μm². If this area is no greater than 0.01 mm², the amount of time necessary to anneal the Ge layer 120 can be shortened in comparison to the dine necessary when this area is greater than 0.01 mm². If there is a large difference between the thermal expansion coefficients of the functional layer and the wafer, it becomes easy for the thermal annealing to cause localized warping in the functional layer. In this case as well, the occurrence of crystal defects in the functional layer due to warping can be restricted by setting this area to be no greater than 0.01 mm².

If the area of the top surface of each Ge layer 120 is no greater than 1600 μm², a high-performance electronic device can be manufactured by using functional layers formed on the Ge layers 120. If this area is no greater than 900 μm², these electronic devices can be manufactured with high yield.

Instead, the area of the top surface of each Ge layer 120 may be greater than or equal to 25 μm². If this area is less than 25 μm² and a crystal is epitaxially grown on a Ge layer 120, the rate of this crystal growth is unstable and disorder in the shape is likely to occur. In addition, if this area is less than 25 μm², processing of the device becomes more difficult and the yield is decreased, which is unfavorable from an industrial viewpoint.

If the top shape of each Ge layer 120 is a square or a rectangle, the length of a side of the top shape may be no greater than 100 μm, preferably no greater than 80 μm, more preferably no greater than 40 μm, and even more preferably no greater than 30 μm. Here, if the top shape of the opening is a rectangle, the "length of a side" referred to above may be the length of a long side.

If the length of a side of the top shape is no greater than 100 μm, the amount of time necessary to anneal the Ge layer 120 can be shortened in comparison to the time necessary when this length is greater than 100 μm. Even if there is a large difference between thermal expansion coefficients of the functional layer and the wafer, the occurrence of crystal defects in the functional layer can be restricted.

If the length of a side of the top shape of each opening is no greater than 80 μm, a high-performance electronic device can be formed by using a functional layer formed on the Ge layers 120. If the length of a side of the top shape is no greater than 40 μm, these electronic devices can be manufactured with high yield.

The Ge layers 120 can be formed using methods such as CVD and MBE (Molecular Beam Epitaxy), for example. The raw material gas may be GeH₄. The Ge layers 120 can be formed using the CVD method with a pressure no less than 0.1 Pa and no greater than 100 Pa. The Ge layers 120 may be formed using the CVD method in an atmosphere that includes raw material gas containing halogen atoms. The gas containing halogen atoms may be a hydrogen chloride gas or a chlorine gas. The Ge layers 120 may be formed by forming a Ge film on the top surface of the Si wafer 102 and patterning this Ge film. The Ge film may be formed using the method described above.

If the top shape of a Ge layer 120 is a polygon, the orientation of at least one side of the polygon may be substantially parallel to one crystallographic surface orientation of the principal surface of the wafer. Here, the term "substantially parallel" includes cases in which one side of the polygon is slightly skewed from being parallel with one crystallographic surface orientation of the wafer. This skew may be no greater than 5°. A stable Ge layer 120 may be Formed in the manner described above. Furthermore, when a crystal is epitaxially grown on a Ge layer 120, disorder in the crystal can be restricted. A stable crystal may be formed in this way. As a result, the crystal can be grown easily and with an ordered shape, thereby achieving a high quality crystal.

The principal surface of the wafer may be the (100) surface, the (110) surface, the (111) surface, or any equivalent surface. The principal surface of the wafer may be skewed slightly from the crystallographic surface orientation described above. In other words, the wafer may have an off angle. This skew may be no greater than 10°. This skew is preferably between 0.05° and 6°, and more preferably between 0.3° and 6°. When forming a Ge layer 120 whose top shape is a square or a rectangle, the principal surface of the wafer may be the (100) surface, the (110) surface, or any equivalent surface. As a result, the Ge layer 120 and the crystal formed on the Ge layer 120 can be stabilized. When growing a rectangular crystal on a Ge layer 120, the principal surface of the wafer may be the (100) surface, the (110) surface, or any equivalent surface. As a result, the crystal can be easily formed to have a four-fold symmetric surface.

The following also describes an example in which a Ge layer 120 having a square or rectangular top shape is formed on the (100) surface of the top surface of the Si wafer 102, and a GaAs crystal, which is an example of an element formation layer 124, is formed on the Ge layer 120. In this case, at least one side of the top shape of the Ge layer 120 may be substantially parallel to one of the directions selected from a group including the <010> direction, the <0-10> direction, the <001> direction, and the <00-1> direction of the Si wafer 102. As a result, the side surfaces of the GaAs crystal can be stabilized.

The following describes another example in which a Ge layer 120 having a hexagonal top shape is formed on the (111) surface of the top surface of the Si wafer 102, and a GaAs crystal, which is an example ° Ian element formation layer 124, is formed on the Ge layer 120. In this case, at least one side of the top shape of the Ge layer 120 may be substantially parallel to one of the directions selected from a group including the <1-10> direction, the <-110> direction, the <0-11> direction, the <01-1> direction, the <10-1> direction, and the <101> direction of the Si wafer 102. As a result, the side surfaces of the GaAs crystal can be stabilized. The top shape of the Ge layer 120 may be an equilateral hexagon. Similarly, instead of a GaAs crystal, a GaN crystal, which is a hexagonal crystal, can be formed.

The Ge layer 120 may be annealed at a temperature below 900° C., preferably 850° C. or lower. As a result, the top surface of the Ge layer 120 can be kept flat. The flatness of the top surface of the Ge layer 120 is particularly important when forming another layer on the top surface of the Ge layer 120. The Ge layer 120 may be annealed at a temperature of 680° C. or higher, preferably 700° C. or higher. As a result, the density of the crystal defects in the Ge layer 120 can be decreased. The Ge layer 120 may be annealed at a temperature that is greater than or equal to 680° C. and below 900° C.

The Ge layer 120 may be annealed in an ambient atmosphere, a nitrogen atmosphere, an argon atmosphere, or a hydrogen atmosphere. In particular, by annealing the Ge layer 120 in an atmosphere that includes hydrogen, the top surface of the Ge layer 120 can be maintained in a smooth state while decreasing the density of crystal defects in the Ge layer 120.

The Ge layer 120 may be annealed with a temperature and duration that enables movement of crystal defects. The crystal defects in the Ge layer 120 move within the Ge layer 120 during the annealing, and are trapped in the top surface of the Ge layer 120 or in a gettering sink within the Ge layer 120, for example. As a result, the crystal defects near the top surface of the Ge layer 120 can be expelled. The top surface of the Ge layer 120 and the gettering sink within the Ge layer 120 are each an example of a defect trapping section that traps crystal defects that can move within the Ge layer 120.

The defect trapping section may be a top surface or an interface with the crystal, or may be a physical flaw. The defect trapping section may be arranged at a distance that enables movement of the crystal defects for the temperature and duration conditions of the annealing.

The Ge layer 120 is an example of a seed layer that provides a seed surface for the functional layer. Another example of a seed surface include $Si_xGe_{1-x}$, where 0≤x<1 The annealing may be performed in two stages including a high-temperature annealing for 2 to 10 minutes at a temperature between 800° C. and 900° C., and low-temperature annealing for 2 to 10 minutes at a temperature between 680° C. and 780° C.

The present embodiment describes an example in which the Ge layer 120 is formed contacting the top surface of the Si wafer 102, but the present invention is not limited to this. For example, another layer may be arranged between the Ge layer 120 and the Si wafer 102. This other layer may be a single layer or may include a plurality of layers.

The Ge layer 120 may be formed according to the following steps. First, a seed crystal is formed at a low temperature. The seed crystal may be $Si_xGe_{1-x}$, where 0≤x<1. The temperature at which the seed crystal is grown may be no less than 330° C. and no greater than 450° C. After this, the temperature of the Si wafer 102 on which the seed crystal is formed is raised to a prescribed temperature, after which the Ge layer 120 may be formed.

The surface of each Ge layer 120 that faces the functional layer may be surface processed with the gas including P. This surface processing can be performed after formation of the Ge layer 120 by performing a $PH_3$ exposure process, for example, to the top surface of the Ge layer 120. As a result, when a crystal is epitaxially grown on the Ge layer 120, the crystallinity of the crystal can be improved. The $PH_3$ processing mentioned above may be performed at a temperature between 500° C. and 900° C., preferably between 600° C. and 800° C., inclusive. The processing does not appear at temperatures below 500° C. and the properties of the Ge layer 120 change at temperatures above 900° C.

The buffer layer 122 is a group 3-5 compound semiconductor layer containing P, and is crystal-grown on the Ge layer 120. Specifically, the buffer layer 122 is formed between the Ge layer 120 and the element formation layer 124, and is a crystal-grown group 3-5 compound semiconductor layer such as an InGaP layer. One example of crystal growth is epitaxial growth. The buffer layer 122 may be a GaAs layer that is crystal-grown at a temperature no greater than 500° C. on the Si wafer 102, and may be formed as an isolated island. The buffer layer 122 layer need not be formed between the Ge layer 120 and the element formation layer 124. If no buffer layer 122 is provided, the surface of the Ge layer 120 that laces the element formation layer 124 can be surface processed with a gas containing P.

The element formation layer 124 is an example of a functional layer. The HBT, which is an example of an electronic element, may be formed on the element formation layer 124 as described above. The element formation layer 124 may be formed to contact the Ge layer 120. In other words, the element formation layer 124 is crystal-grown contacting the Ge layer 120 or with the buffer layer 122 therebetween. One example of crystal growth is epitaxial growth.

The element formation layer 124 may be a group 3-5 compound layer or a group 2-6 compound layer that lattice matches or pseudo-lattice matches with Ge. The element formation layer 124 may be a group 3-5 compound layer that lattice matches or pseudo-lattice matches with Ge, in which the group 3 element includes at least one of Al, Ga, and In and the group 5 element includes at least one of N, P, As, and Sb. For example, the element formation layer 124 may be a GaAs layer. Pseudo-lattice matching means that there is only a small difference between the lattice constants of the two semiconductor layers in contact with each other, and so, although this is not complete lattice matching, the lattice matching is close enough that the occurrence of defects due to lattice mismatching is negligible, and so these two contacting semiconductor layers can be considered to be in a layered state. For example, the layered state of the Ge layer and the GaAs layer can be considered as pseudo-lattice matching.

The element formation layer 124 may have an arithmetic mean roughness value (sometimes referred to hereinafter as the "Ra value") that is no greater than 0.02 µm, preferably no greater than 0.01 µm. As a result, a high-performance electronic device can be formed using the element formation layer 124. Here, the Ra value is an indicator of the surface roughness, and can be calculated according to JIS B0601-2001. The Ra value can be obtained by dividing (i) the area between a roughness curve and a central line over a prescribed length by (ii) the measured length.

If the element formation layer 124 is a group 3-5 compound layer that includes at least one element selected from a group including Al, Ga, and In as a group 3 element and includes at least one element selected from a group including N, P, As, and Sb as a group 5 element, then the growth rate or the element formation layer 124 is no greater than 300 nm/min, preferably no greater than 200 nm/min, and more preferably no greater than 60 nm/min. As a result, the Ra value of the element formation layer 124 can be held at 0.02 µm or less. The growth rate of the element formation layer 124 may be no less than 1 nm/min, preferably no less than 5 nm/min. As a result, a high-quality element formation layer 124 can be achieved without sacrificing the rate of production. For example, the element formation layer 124 may be crystal-grown with a rate between 1 nm/min and 300 nm/min, inclusive.

When a plurality of Ge layers 120 are formed to be separated from each other on the Si wafer 102, an element formation layer 124 may be formed on each of the Ge layers 120. A semiconductor wafer can be obtained that includes an Si wafer, a plurality of Ge layers 120 formed on the wafer and separated from each other, and functional layers formed on the Ge layers 120. Here, the element formation layers 124 may lattice match or pseudo-lattice match with the Ge layers 120.

Electronic elements such as HBTs may be formed on the element formation layers 124. As a result, an electronic device can be obtained that includes an Si wafer, a plurality of Ge layers 120 formed on the wafer and separated from each other, functional layers formed on the Ge layers 120, and electronic elements formed on the functional layers. One electronic element may be formed on each Ge layer 120. The electronic elements may be heterojunction bipolar transistors. The electronic elements may be connected to each other. The electronic elements may be connected in parallel.

The present embodiment describes an example in which an element formation layer 124 is formed on the top surface of a Ge layer 120, but the present invention is not limited to this. For example, an intermediate layer may be arranged between the Ge layer 120 and the element formation layer 124. This intermediate layer may be a single layer or may include a plurality of layers. The intermediate layer may be formed at a temperature no greater than 600° C., preferably no greater than 550° C. As a result, the crystallinity of the element formation layer 124 can be improved. The intermediate layer may be formed at a temperature no less than 400° C. The intermediate layer may be formed at a temperature between 400° C. and 600° C., inclusive. As a result, the crystallinity of the element formation layer 124 can be improved. The intermediate layer may be a GaAs layer formed at a temperature no greater than 600° C., preferably no greater than 550° C.

The element formation layer 124 may be formed according to the following steps. First, the intermediate layer is formed on the top surface of the Ge layer 120. The temperature at which the intermediate layer is grown may be no greater than 600° C. After this, the temperature of the Si wafer 102 on which the intermediate layer is formed is raised to a prescribed temperature, after which the element formation layer 124 may be formed.

The semiconductor wafer 101 can be manufactured by, for example, forming a plurality of Ge layers 120 separated from each other on the Si wafer 102 and then forming element formation layers 124 on the Ge layers 120. The semiconductor wafer 101 may be manufactured such that the element formation layers 124 lattice match or pseudo-lattice match with the Ge layers 120. After firming the plurality of Ge layers 120 and before forming the element formation layers 124, GaAs layers may be formed at a temperature no greater than 600° C. After forming the plurality of Ge layers 120 and before forming the element formation layer 124, the top surface of each Ge layer 120 may be processed with a gas containing P.

Figure 3:
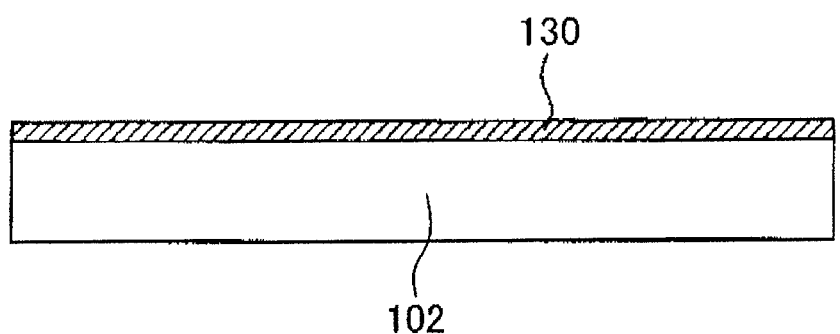
FIG. 3 is an exemplary cross-sectional view of a step for manufacturing the semiconductor wafer 101.

FIGS. 3 to 7 are exemplary cross-sectional views of steps for manufacturing the semiconductor wafer 101. As shown in FIG. 3, the Si wafer 102 is prepared and the Ge film 130 is formed on the top surface of the Si wafer 102 using epitaxial growth, for example. The epitaxial growth of the Ge layers 120 may be achieved using methods such as MOCVD (Metal Organic Chemical Vapor Deposition) and MBE (Molecular Beam Epitaxy). The raw material gas may be $GeH_4$.

Figure 4:
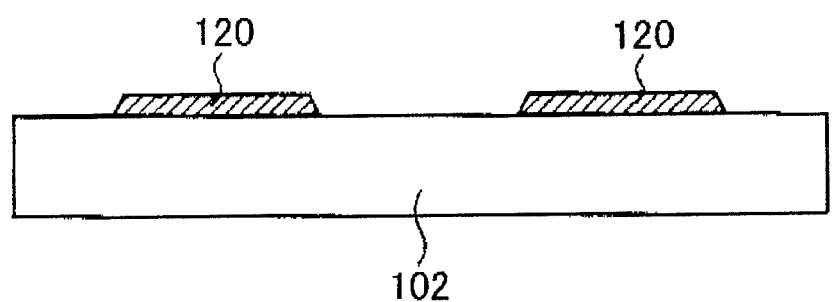
FIG. 4 is an exemplary cross-sectional view of a step for manufacturing the semiconductor wafer 101.

As shown in FIG. 4, a Ge film 130 is patterned to form the island-shaped Ge layers 120. The patterning may be achieved by photolithography, for example.

Figure 5:
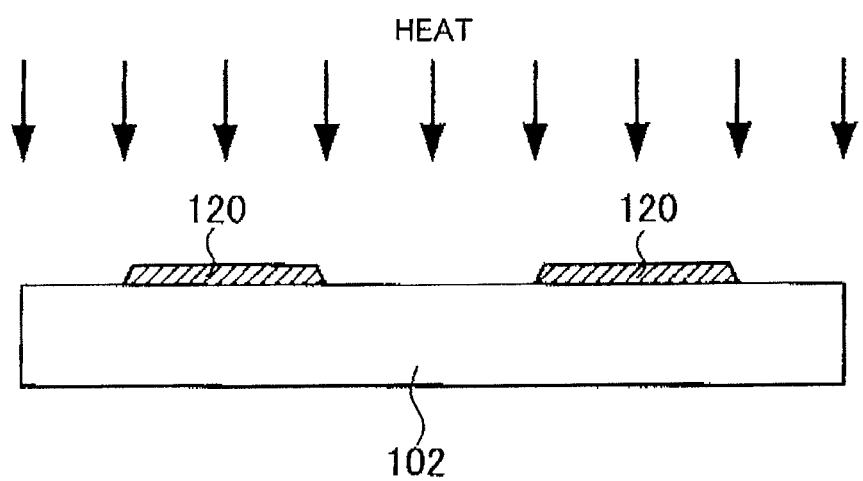
FIG. 5 is an exemplary cross-sectional view of a step for manufacturing the semiconductor wafer 101.

As shown in FIG. 5, the patterned Ge layers 120 are thermally annealed. The thermal annealing may be performed in two stages including a high-temperature annealing at a temperature below the melting point of Ge and low-temperature annealing at a temperature lower than the temperature of the high-temperature annealing. The two-stage annealing can be repeated multiple times. The duration and temperature of the high-temperature annealing may be 10 minutes at 900° C., and the duration and temperature of the low-temperature annealing may be 10 minutes at 780° C. The number of repetitions of this annealing may be 10.

In the present embodiment, the two-stage annealing may be performed multiple times on the Ge layers 120 patterned into island shapes. Therefore, the crystal defects that are present during the epitaxial growing and the patterning can be moved to the edges of the Ge layers 120 by the annealing, and the density of the crystal defects in the Ge layers 120 can then be reduced to a very low level by expelling the moved crystal defects from the edges of the Ge layers 120. As a result, the defects caused by wafer materials of an epitaxial thin film to be formed later, for example, can be decreased, thereby improving the capabilities of the electronic elements formed on the element formation layer 124. Furthermore, even if there is a type of thin film that cannot be crystal-grown directly on a silicon wafer due to lattice mismatching, a high quality crystal thin film can be formed having Ge layers 120 with superior crystallinity as the wafer material.

Figure 6:
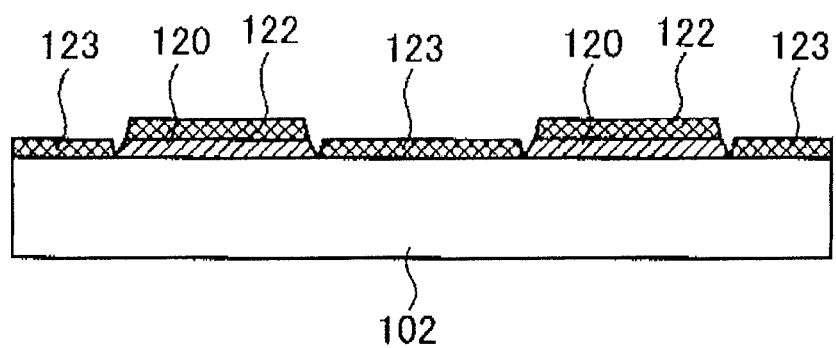
FIG. 6 is an exemplary cross-sectional view of a step for manufacturing the semiconductor wafer 101.

As shown in FIG. 6, InGaP layers are crystal-grown, as an example of the buffer layers 122, on the Ge layers 120. One example of crystal growth is epitaxial growth. InGaP layers 123 are also grown on portions of the Si wafer 102 where the Ge layers 120 are not formed. However, the InGaP layers 123 have poor crystallinity, and so electronic elements are not formed thereon. The InGaP layers 123 may be removed by etching, for example.

The epitaxial growth of the InGaP layers can be achieved using methods such as MOCVD and MBE, for example. The raw material gas may be TM-Ga (trimethylgallium), TM-In (trimethylindium), and $PH_3$ (phosphine). The epitaxial growth of the InGaP layers involves forming a crystal thin film in an atmosphere with a temperature above 650° C., for example.

In the present embodiment, annealing is performed on the Ge layers 120 at the stage shown in FIG. 5. However, the annealing can instead be performed after formation of the buffer layers 122 at the stage shown in FIG. 6. In other words, the buffer layers 122 and the InGaP layers 123 can be formed after the Ge layers 120 without annealing being performed therebefore, and the buffer layers 122 and the Ge layers 120 can then be annealed.

Figure 7:
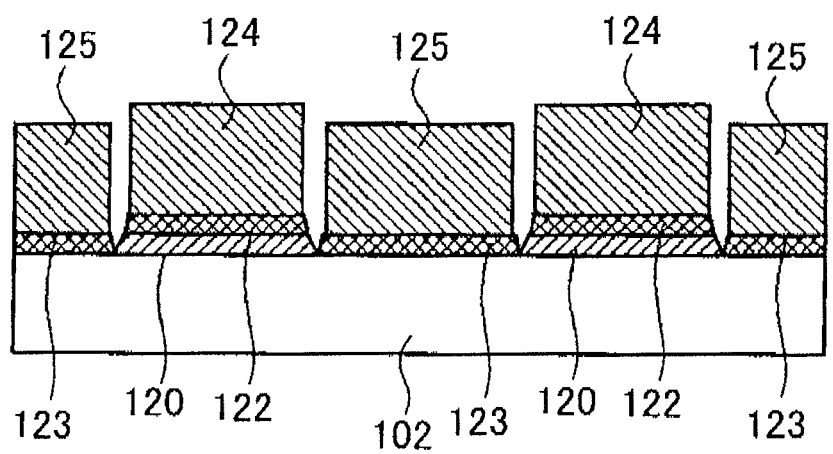
FIG. 7 is an exemplary cross-sectional view of a step for manufacturing the semiconductor wafer 101.

As shown in FIG. 7, the buffer layers 122 are epitaxially grown, for example, on the element formation layers 124. An annexing layer 125 is formed at the same time that the element formation layers 124 are formed on the InGaP layers 123. The annexing layer 125 has poor crystallinity, and so electronic elements are not formed thereon. The annexing layer 125 may be removed by etching, for example.

The element formation layers 124 may be a GaAs-type layered film that includes a GaAs layer or an InGaAs layer, for example. The epitaxial growth of the GaAs layer or the GaAs-type layered film can be achieved using methods such as MOCVD and MBE, for example. The raw material gas may be TM-Ga (trimethylgallium), AsH$_3$ (arsine), or some other gas. The growth temperature may be between 600° C. and 650° C.

After this, if electronic elements such as the HBTs are formed on the element formation layers 124 using a known method, the semiconductor wafer 101 shown in FIG. 2 can be obtained. With the method described above, the semiconductor wafer 101 of the present embodiment can be manufactured.

In the semiconductor wafer 101 of the present embodiment, the Ge layer 120 is divided into sections by etching, for example, to form the island-shaped Ge layers 120. The two-stage annealing is performed on the Ge layers 120 to improve the crystallinity, and the InGaP layers are formed as the buffer layers 122. Therefore, a semiconductor wafer 101 can be obtained that has GaAs layers with good crystallinity as the element formation layers 124. Since the semiconductor wafer 101 uses an Si wafer 102, the semiconductor wafer 101 can be manufactured at a low cost and the heat generated by the electronic elements formed on the element formation layers 124 can be efficiently released.

The annealing performed on the Ge layers 120 described in FIG. 5 is not absolutely necessary. Even if the Ge layers 120 are not annealed, the buffer layers 122 can, to a certain extent, improve the crystallinity.

Figure 8:
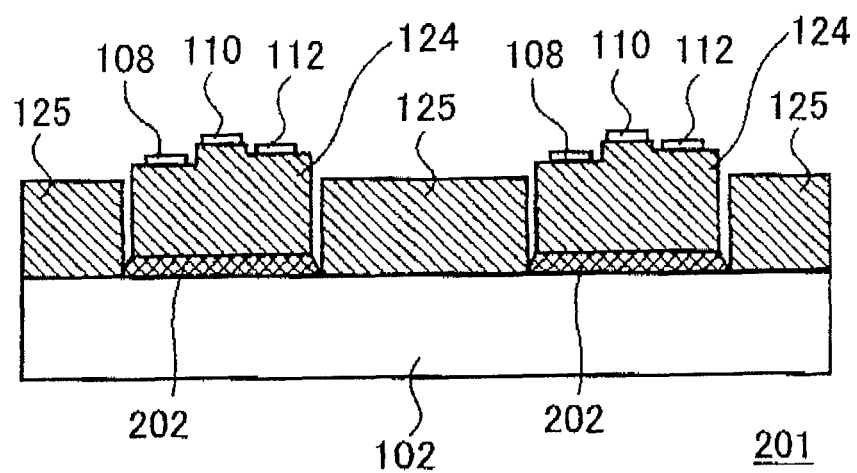
FIG. 8 shows an exemplary cross-section of a semiconductor wafer 201 according to another embodiment of the present invention.

FIG. 8 shows an exemplary cross-section of a semiconductor wafer 201 according to another embodiment of the present invention. The semiconductor wafer 201 is the same as the semiconductor wafer 101 except that the semiconductor wafer 201 does not use a Ge layer 120, but does include, as a buffer layer 202, a GaAs layer crystal-grown at a temperature no greater than 500° C. The following describes only points that differ from the semiconductor wafer 101.

Figure 9:
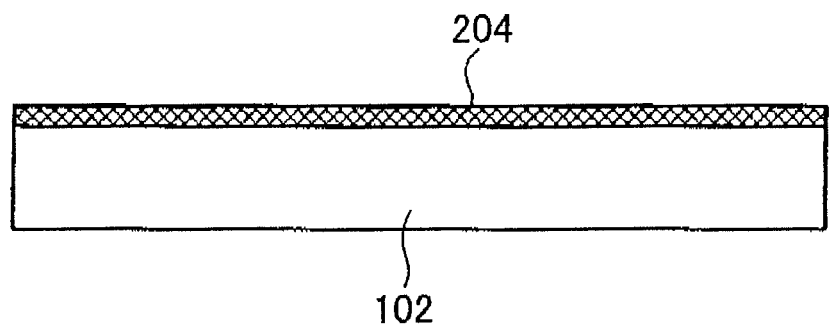
FIG. 9 is an exemplary cross-sectional view of a step for manufacturing the semiconductor wafer 201.

FIGS. 9 and 10 are exemplary cross-sectional views of steps for manufacturing the semiconductor wafer 201. As shown in FIG. 9, an Si wafer 102 is prepared and a GaAs film 204 is crystal-grown at a temperature no greater than 500° C. on the top surface of the Si wafer 102. The growth of the GaAs film 204 can be achieved using methods such as MOCVD and MBE, for example. The raw material gas may be TE-Ga (triethylgallium), AsH$_3$ (arsine), or some other gas. The growth temperature may be 450° C.

Next, as shown in FIG. 10, photolithography is used to etch the GaAs film 204, thereby forming the buffer layers 202 as independent islands. The following steps are the same as those performed for the semiconductor wafer 101.

In the semiconductor wafer 201, the GaAs layer serving as the buffer layer 202 is formed at a temperature no greater than 500° C. Even though the buffer layer 202 realized by the GaAs layer is grown at a low temperature, the crystallinity of the element formation layer 124 is somewhat improved. Therefore, in the same way as the semiconductor wafer 101, the semiconductor wafer 201 can be provided at low cost and a high-performance electronic element can be formed on the element formation layer 124.

Figure 11:
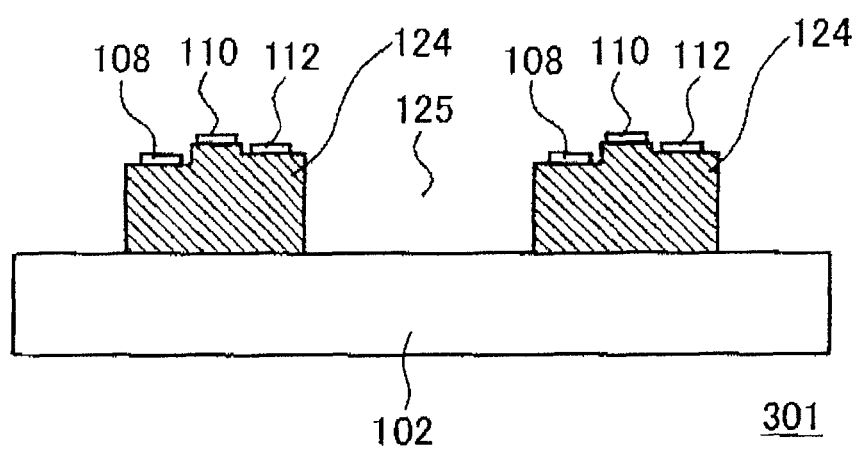
FIG. 11 shows an exemplary cross-section of a semiconductor wafer 301 according to yet another embodiment of the present invention.
Figure 12:
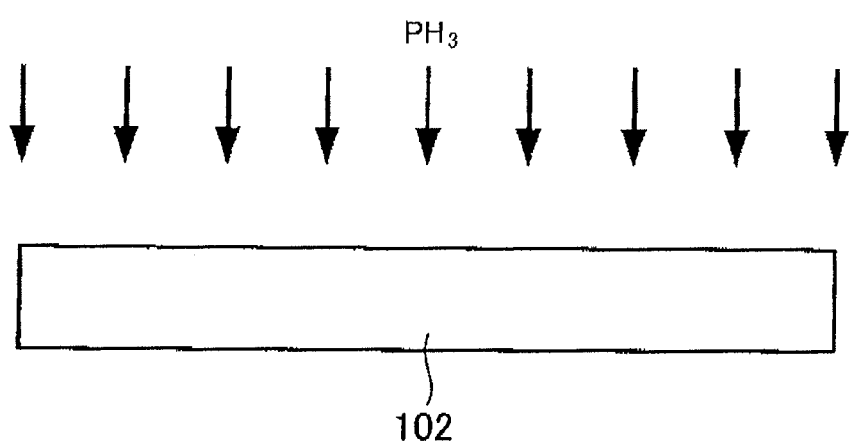
FIG. 12 is an exemplary cross-sectional view of a step for manufacturing the semiconductor wafer 301.

FIG. 11 shows an exemplary cross-section of a semiconductor wafer 301 according to yet another embodiment of the present invention. In the semiconductor wafer 301, the top surface of the Si wafer 102 is surface processed with a gas containing P. FIG. 12 is an exemplary cross-sectional view of a step for manufacturing the semiconductor wafer 301. As shown in FIG. 12, the top surface of the Si wafer 102 is exposed to PH$_3$, for example. The exposure process may be performed in a high-temperature atmosphere and may involve activating PH$_3$ with plasma or the like.

The element formation layers 124 can be formed as isolated islands by crystal-growing the GaAs film, for example, as an element formation layer 124 on the top surface of the Si wafer 102 that has been exposed to PH$_3$ and then performing etching, using photolithography or the like.

After the PH$_3$ exposure process shown in FIG. 12, the steps shown from FIG. 9 onward can be performed to form a semiconductor wafer similar to the semiconductor wafer 201 shown in FIG. 8. Specifically, the GaAs film 204 can be crystal-grown at a temperature no greater than 500° C. by exposing the top surface of the semiconductor wafer 201 to PH$_3$, for example, and the buffer layers 202 can be formed as island-shaped GaAs layers by patterning this GaAs film 204.

When the butler layers 202 are GaAs layers that are formed at a temperature no greater than 500° C. after the top surface of the Si wafer 102 is surface processed with a raw material gas containing P, GaAs layers with good crystallinity can be formed as the element formation layers 124. Therefore, in the same way as the semiconductor wafer 101, a semiconductor wafer can be provided at low cost and a high-performance electronic element can be formed on the element formation layer 124.

EMBODIMENTS

First Embodiment

The following experiments were performed to investigate the effect of the annealing temperature on the flatness of the top surface of a Ge layer. The experimentation was performed by annealing a Ge layer formed on the top surface of an Si wafer and observing a cross-sectional shape of the annealed Ge layer. The effect of the annealing temperature on the flatness of the top surface of the Ge layer was examined by performing this experimentation for different annealing temperatures.

The Ge layer was formed according to the following steps. First, the thermal oxidation method was used to form an SiO$_2$ layer on the top surface of the Si wafer. The Si wafer was a commercial single-crystal Si wafer. Etching was then used to form an opening in the SiO$_2$ layer. The planar shape of the SiO$_2$ layer was a square in which a side had a length of 400 µm. The "planar shape" of the SiO$_2$ layer refers to the shape projected by the SiO$_2$ layer onto the principal surface of the wafer. In the following, the "bottom shape" of the opening refers to the shape of the opening on a surface on the Si wafer side of the SiO$_2$ layer in which the opening is formed.

Next, the CVD method was used to selectively epitaxially grow the Ge layer within the opening. The raw material gas was GeH$_4$. The flow rate and deposition time of the raw material gas were each set to a prescribed value.

Figure 13:
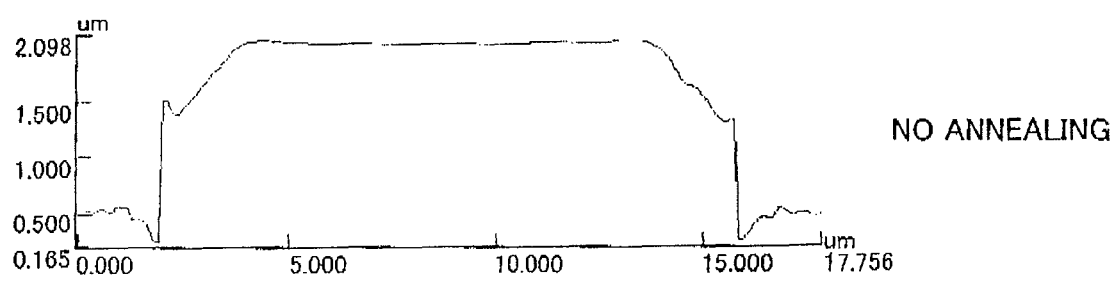
FIG. 13 shows the cross-sectional shape of the Ge layer that is not annealed.
Figure 17:
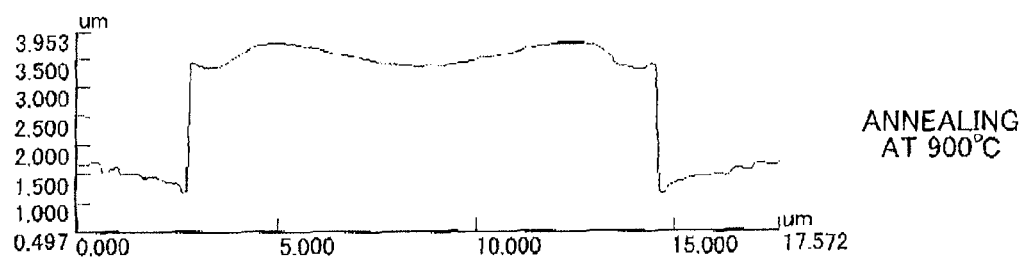
FIG. 17 shows the cross-sectional shape of the Ge layer that is annealed at 900° C.

FIGS. 13 to 17 show a relationship between the annealing temperature and the flatness of the Ge layer. FIG. 13 shows the cross-sectional shape, of a Ge layer that is not annealed. FIGS. 14 to 17 respectively show cross-sectional shapes of Ge layers after being annealed at temperatures of 700° C., 800° C., 850° C., and 900° C. The cross-sectional shape of the Ge layers can be observed by a laser microscope. The vertical axis in each of these Figures represents the distance in a direction perpendicular to the principal surface of the Si wafer, and shows the thickness of the Ge layer. The horizontal axis in each of these Figures represents the distance in a direction parallel to the principal surface of the Si wafer.

Based on FIGS. 13 to 17, it is understood that lower annealing temperatures lead to favorable flatness of the top surface of the Ge layer. The top surface of the Ge layer exhibits especially good flatness when the annealing temperature is below 900° C.

Second Embodiment

The following experiments were performed to examine the effect of (i) the relationship between the top shape of the Ge layer and the crystallographic orientation of the wafer on (ii) the crystal formed on the Ge layer. This experimentation was performed by growing a GaAs crystal on the Ge layer after forming the Ge layer on the (100) surface of the Si wafer, and observing the shape of the GaAs crystal. By performing the above experiment for different relationships between the top shape of the Ge layer and the crystallographic orientation of the Si wafer, the effect of this relationship on the crystal grown on the Ge layer was examined.

The Ge layer was (brined according to the following steps. First, an $SiO_2$ layer was formed on the top surface of the Si wafer. The Si wafer was a commercial single-crystal Si wafer. The surface orientation of the top surface of the Si wafer was the (100) surface of Si. Etching was used to form an opening with a prescribed shape in the $SiO_2$ layer. More than two $SiO_2$ layers of the prescribed size were formed on the top surface of the Si wafer. The $SiO_2$ layers having the prescribed size were formed at uniform intervals of 500 μm. Etching was then used to form an opening having a prescribed bottom shape in each $SiO_2$ layer. Each opening was formed such that a side of the bottom shape thereof was substantially parallel to a <010> direction or a <011> direction of the Si wafer. When the bottom shape of an opening was a rectangle, the opening was formed such that a long side of the rectangle was parallel to the direction <010> or the direction <011> of the Si wafer.

Next, the CVD method was used to selectively grow Ge layers within the openings. The raw material gas was $GeH_4$. The flow rate and deposition time of the raw material gas were each set to a prescribed value. Next, the MOCVD method was used to form GaAs crystals on the annealed Ge layers. The GaAs crystals were epitaxially grown on the top surfaces of the Ge layers within the openings under conditions of 620° C. and 8 MPa. The raw material gas used was trimethylgallium. The flow rate and deposition time of the raw material gas were each set to a prescribed value.

Figure 18:
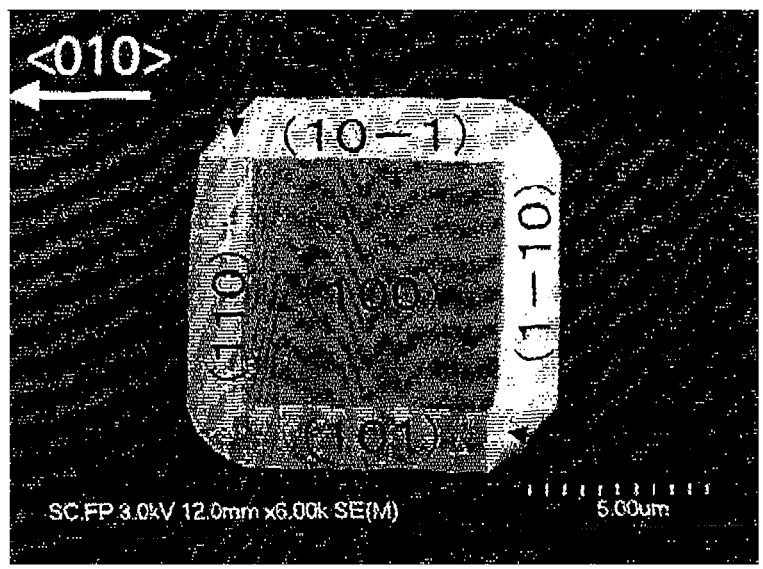
FIG. 18 shows an electron microscope image of a GaAs crystal formed within an opening having an edge that is parallel to the <010> direction of the Si wafer.
Figure 19:
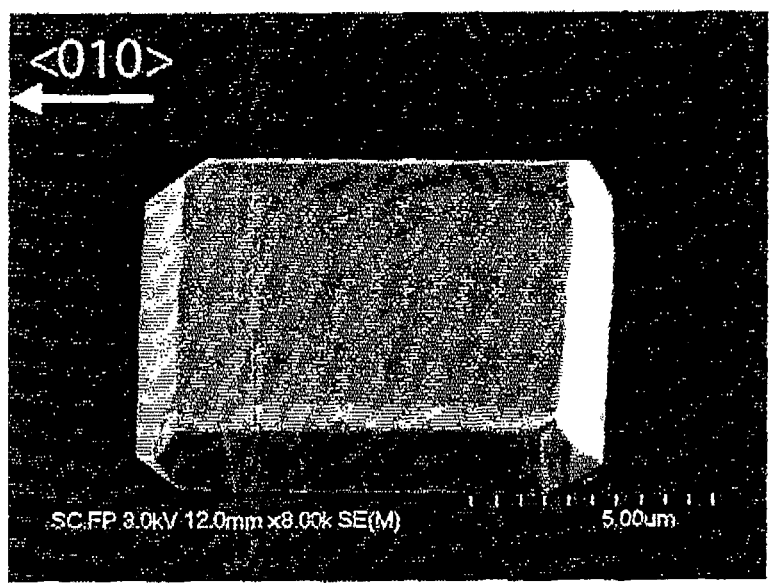
FIG. 19 shows an electron microscope image of a GaAs crystal formed within an opening having an edge that is parallel to the <010> direction of the Si wafer.
Figure 20:
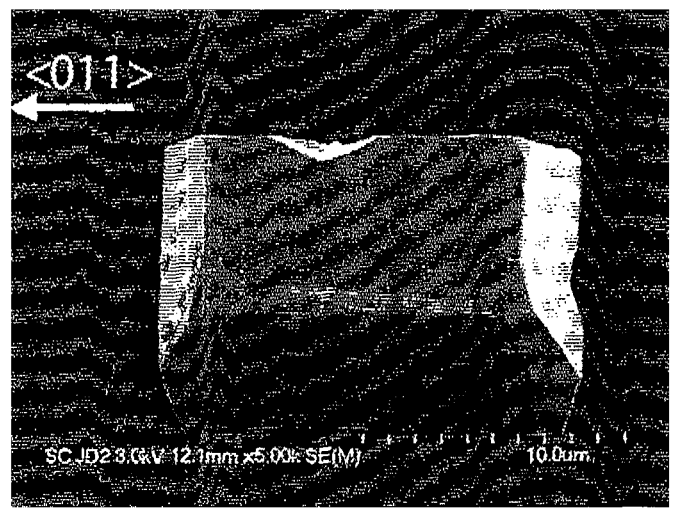
FIG. 20 shows an electron microscope image of a GaAs crystal formed within an opening having an edge that is parallel to the <011> direction of the Si wafer.

As described above, GaAs crystals were formed while changing the positional relationship between the crystallographic orientation of the Si wafer and the bottom shape of the opening. In each case, the top surface state of the formed GaAs crystal was observed using an electron microscope. FIGS. 18 to 20 show electron microscope images of the top surface of each GaAs crystal formed on a Ge layer.

FIG. 18 shows results obtained when a GaAs crystal was grown within an opening that was formed in the $SiO_2$ layer such that a side of the bottom shape of the opening was substantially parallel to the <010> direction of the Si wafer. In the present embodiment, the planar shape of the $SiO_2$ layer was a square in which each side had a length of 300 μm. The bottom shape of the opening was a square in which a side is 10 μm. In FIG. 18, the arrow represents the direction <010>. As shown in FIG. 18, the obtained crystal had an ordered shape.

Based on FIG. 18, it is understood that the four side surfaces of the GaAs crystal are the (10-1) surface, the (1-10) surface, the (101) surface, and the (110) surface. Furthermore, it is understood from FIG. 18 that there is a (11-1) surface at the upper left corner of the GaAs crystal and a (1-11) surface at the lower right corner of the GaAs crystal. The (11-1) surface and the (1-11) surface are equivalent to a (-1-1-1) surface, and these are stable surfaces.

It is further understood from FIG. 18 that such stable surfaces are not present at the upper right corner or the lower left corner of the GaAs crystal. For example, in FIG. 18, even though a (111) surface may be present at the bottom left corner, this (111) surface is not present in this case. This is believed to be because the bottom left corner is sandwiched between the (110) surface and the (101) surface, which are more stable than the (111) surface.

FIG. 19 shows results obtained when a GaAs crystal was grown within an opening that was formed in the $SiO_2$ layer such that a side of the bottom shape of the opening was substantially parallel to the <010> direction of the Si wafer. FIG. 19 shows results as seen from above at a 45° angle. In the present embodiment, the planar shape of the $SiO_2$ layer was a square in which each side had a length of 50 μm. The bottom shape of the opening was a square in which the length of a side is 10 μm. In FIG. 19, the arrow represents the direction <010>. As shown in FIG. 19, the obtained crystal had an ordered shape.

FIG. 20 shows results obtained when a GaAs crystal was grown within an opening that was formed in the $SiO_2$ layer such that a side of the bottom shape of the opening was substantially parallel to the <011> direction of the Si wafer. In the present embodiment, the planar shape of the $SiO_2$ layer was a square in which each side had a length of 400 μm. The bottom shape of the opening was a square in which the length of a side is 10 μm. In FIG. 20, the arrow represents the direction <011>. As shown in FIG. 20, the obtained crystal had a shape that was more disordered than the shapes shown in FIGS. 18 and 19. This is believed to be because, as a result of the relatively unstable (111) surface appearing on the side surface of the GaAs crystal, disorder occurred in the shape of the crystal.

Third Embodiment

The following experiments were performed to examine the relationship between the growth rate of a crystal formed on a Ge layer and the surface roughness of this crystal. This experimentation was performed by growing a GaAs crystal on a Ge layer after forming the Ge layer on the top surface of the Si wafer, and observing the cross-sectional shape and the thickness of the GaAs crystal grown during a prescribed time. The effect of the growth rate of the GaAs crystal on the roughness of the top surface of the GaAs crystal was examined by performing this experimentation for different growth rates of the GaAs crystal.

With the same steps used when forming the Second Embodiment, Ge layers and GaAs layers were formed on an Si wafer. In this embodiment, during the patterning of the $SiO_2$ layers, the $SiO_2$ layers were formed to have planar shapes in which length of a side is 200 μm, 500 μm, 700 μm, 1000 μm, 1500 μm, 2000 μm, 3000 μm, and 4250 μm, respectively. In this embodiment, the $SiO_2$ layers were formed in a manner to be surrounded by the top surface of the Si wafer when seen from above.

For each of the planar shape side lengths stated above, experimentation was performed for three bottom shapes of the opening, which are a square in which a side is 10 μm, a square in which a side is 20 μm, and a rectangle in which a short side is 30 μm and a long side is 40 μm. Each opening was formed such that a side of the bottom shape thereof was substantially parallel to a <010> direction of the Si wafer. When the bottom shape of an opening was a rectangle, the opening was formed such that a long side of the rectangle was parallel to the <010> direction of the Si wafer. The growth conditions for the Ge layers and the GaAs layers were the same as those used in the Second Embodiment.

As described above, GaAs crystals were formed while changing the bottom shape of the openings and the planar shape of the SiO₂ layers. In each case, the cross-sectional shape and the thickness of the GaAs layer formed during a prescribed time were observed using an electron microscope. The thickness of the GaAs crystal was calculated by using a surface profiler (Surface Profiler P-10 manufactured by KLA Tencor) to measure the thickness at three points of the GaAs crystal and calculating the average thickness of these three points. The cross-sectional shape of the GaAs crystal was observed using a laser microscope. This thickness may instead be calculated by using a transmission electron microscope or a scanning electron microscope to directly measure the thickness at three points of the element formation layer 124 according to a cross-section observation method, and calculating the average thickness of these three points.

Fourth Embodiment

The following experiments were performed to examine the relationship between the growth rate of a crystal formed on a Ge layer and the surface roughness of this crystal. The amount of trimethylgallium supplied was cut in half to approximately halve the growth rate of the GaAs crystals, but otherwise, the same experimentation as in the Third Embodiment was used. In this embodiment, during the patterning of the SiO₂ layers, the SiO₂ layers were formed to have planar shapes in which length of a side is 200 μm, 500 μm, 1000 μm, 2000 μm, 3000 μm, and 4250 μm, respectively. The bottom shape of each opening was a square in which a side is 10 μm.

As described above, GaAs crystals were formed while changing the planar shape of the SiO₂ layers. In each case, the cross-sectional shape and the thickness of the GaAs layer formed during a prescribed time were observed using an electron microscope. In order to observe the cross-sectional shape and the thickness of the GaAs crystals, the SiO₂ layers were removed after formation of the GaAs crystals. The cross-sectional shape and the thickness of each GaAs crystal was observed in the same manner as in the Third Embodiment.

Figure 21:
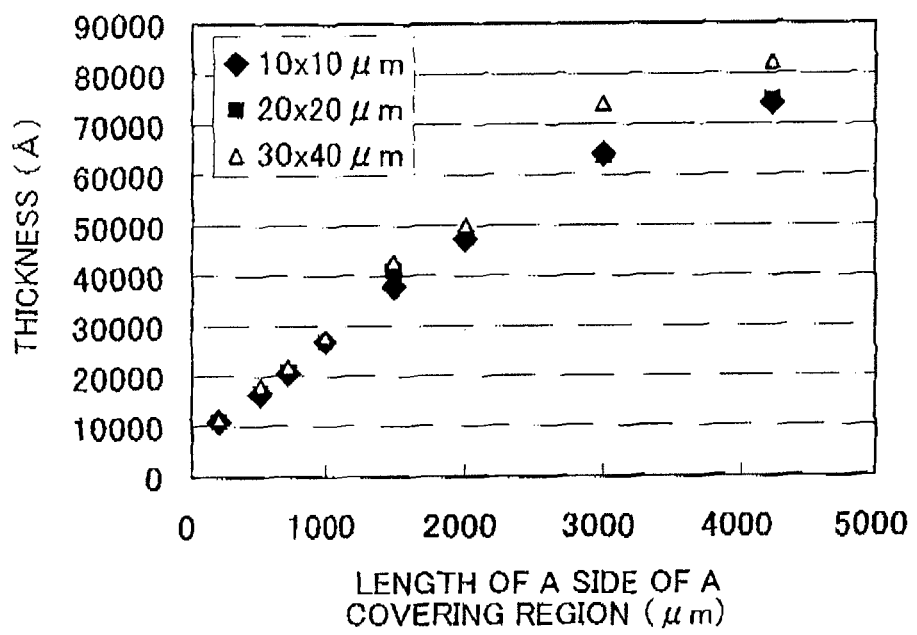
FIG. 21 shows thickness of the GaAs crystals formed in openings.

The experimental results from the Third and Fourth Embodiments are shown in FIG. 21 and Table 1. FIG. 21 shows an average value of the thickness of the GaAs crystal for each wafer according to the Third Embodiment. Table 1 shows an Ra value and a growth rate of the GaAs crystal for each wafer according to the Third and Fourth Embodiments. In the Specification and Figures, the SiO₂ layers described above are sometimes referred to as "covering regions." The length of a side of the bottom shape of an opening may be referred to as the "length of a side of the opening." The length of a side of the planar shape of an SiO₂ layer may be referred to as the "length of a side of the SiO₂ layer" or the "length of a side of the covering region."

FIG. 21 shows a relationship between (i) the growth rate of the GaAs crystals and (ii) the planar shape of the SiO₂ layers and the planar shape of the openings. In FIG. 21, the vertical axis represents the thickness of a GaAs crystal grown during a prescribed time, and the horizontal axis represents the length (μm) of a side of an SiO₂ layer. In the present embodiment, the thickness of the GaAs crystal is the thickness grown during a prescribed time, and so an approximate value of the growth rate of the GaAs crystal can be calculated by dividing this thickness by the prescribed time.

In FIG. 21, the rhomboid plotting points represent experimental data obtained when the bottom shape of the opening is a square in which a side is 10 μm, and the square plotting points represent experimental data obtained when the bottom shape of the opening is a square in which a side is 20 μm. Furthermore, the triangular plotting points represent experimental data obtained when the bottom shape of the opening is a rectangle in which a long side is 40 μm and a short side is 30 μm. Based on FIG. 21, it is understood that the growth rate increases stably until the size of the SiO₂ layer increases to a point at which the length of a side of the SiO₂ layer reaches 4250 μm.

Table 1 shows an Ra value (μm) and a growth rate (Å/min) of the GaAs crystal for each wafer according to the Third and Fourth Embodiments. The thickness of each GaAs crystal was measured by a surface profiler. The Ra value was calculated based on the results observed using a laser microscope device. Based on Table 1, it is understood that lower growth rate for the GaAs crystal results in lower surface roughness. Furthermore, it is understood that the Ra value is no greater than 0.02 μm when the growth rate of the GaAs crystal is no greater than 300 nm/min.

TABLE 1

| COVERING REGION SIDE LENGTH [μm] | SECOND EMBODIMENT | | THIRD EMBODIMENT | |
|---|---|---|---|---|
| | GROWTH RATE [Å/min] | Ra VALUE [μm] | GROWTH RATE [Å/min] | Ra VALUE [μm] |
| 200 | 526 | 0.006 | 286 | 0.003 |
| 500 | 789 | 0.008 | 442 | 0.003 |
| 1000 | 1216 | 0.012 | 692 | 0.005 |
| 2000 | 2147 | 0.017 | 1264 | 0.007 |
| 3000 | 3002 | 0.02 | 1831 | 0.008 |
| 4250 | 3477 | 0.044 | 2190 | 0.015 |

Fifth Embodiment

The following experiments were performed to examine the effect of (i) top shape of the Ge layer on (ii) the characteristics and yield of an electronic device that uses a functional layer formed on the Ge layer. These experiments were performed by manufacturing HBT elements using functional layers formed on Ge layers, and measuring the current gain β and the base sheet resistance value Rb (Ω/□) of the HBT elements. The effect of the top shape of the Ge layer on the characteristics and yield of the above electronic device was examined by performing this experimentation for different top surface areas of the Ge layer.

Each HBT element was manufactured using the following steps. First, a semiconductor wafer including an Si wafer, a Ge layer, and a GaAs layer serving as an element formation layer was manufactured. Next, the HBT elements were manufactured by forming semiconductor layers on the semiconductor wafer.

The semiconductor wafer was manufactured using the following steps. First, SiO₂ layers were formed on the top surface of the Si wafer and Ge layers were formed within openings in the SiO₂ layers, in the same way as in the Third Embodiment. After forming the Ge layers, annealing was performed.

Experimentation was performed for HBT elements having five bottom shapes of the opening, which were a square in which a side is 20 μm, a rectangle in which a short side is 20 μm and a long side is 40 μm, a square in which a side is 30 μm, a rectangle in which a short side is 30 μm and a long side is 40 μm, and a rectangle in which a short side is 20 μm and a long side is 80 μm.

When the bottom shape of the opening was a square, the opening was formed such that one of two orthogonal sides of the bottom shape of the opening was parallel to the direction <010> of the Si wafer, and the other of the two orthogonal sides is parallel to the direction <001> of the Si wafer. When the bottom shape of the opening was a rectangle, the opening was formed such that a long side of the bottom shape of the opening was parallel to the direction <010> of the Si wafer, and a short side was parallel to the direction <001> of the Si wafer. Experimentation was performed mainly for cases in which the planar shape of the $SiO_2$ layer was a square in which a side had a length of 300 μm.

In the present embodiment, intermediate layers were formed between the Ge layers and the GaAs layers. The intermediate layers were formed on the Ge layers using the MOCVD method, after annealing the Ge layers. The intermediate layers were formed with the temperature of the Si wafer on which the Ge layers are formed being set to 550° C. The intermediate layers were grown using trimethylgallium and arsine as the raw material gas. The thickness of each intermediate layer was 30 nm. Next, the Si wafer on which the intermediate layers are formed was raised to a temperature of 640° C., after which the MOCVD method was used to form the GaAs layers. The thickness of each GaAs layer was 500 nm.

Next, the MOCVD method was used to form semiconductor layers on the top surface of the GaAs layers. As a result, HBT element structures were formed that each included, in the stated order, the Si wafer, a Ge layer with a thickness of 850 nm, an intermediate layer with a thickness of 30 nm, an undoped GaAs layer with a thickness of 500 nm, an n-type GaAs layer with a thickness of 300 nm, an n-type InGaP layer with a thickness of 20 nm, an n-type GaAs layer with a thickness of 3 nm, a GaAs layer with a thickness of 300 nm, a p-type GaAs layer with a thickness of 50 nm, an n-type InGaP layer with a thickness of 20 nm, an n-type GaAs layer with a thickness of 120 nm, and an n-type InGaAs layer with a thickness of 60 nm. In the semiconductor layers described above, Si was used as the n-type impurity. In the semiconductor layers described above, C was used as the p-type impurity. Electrodes were arranged on the resulting HBT element structures to form HBT elements.

In the manner described above, HBT elements were manufactured having openings with different top shapes. The base sheet resistance value $R_b$ (Ω/□) and the current gain β of the HBT element manufactured in each case were measured. The current gain β was calculated by dividing the value of the collector current by the value of the base current.

FIG. 22 shows a relationship between the bottom area (μm²) of the opening and a ratio of the current gain β to the base sheet resistance value $R_b$ of the HBT elements described above. The area of the top surface of each Ge layer is approximately equal to the area of the bottom shape of the opening. The length of a side of the top shape of each Ge layer is substantially equal to the length of a side of the bottom shape of the opening.

In FIG. 22, the vertical axis represents a value obtained by dividing the current gain β by the base sheet resistance value $R_b$ (Ω/□), and the horizontal axis represents the area of the bottom shape of the opening. FIG. 22 does not show the current gain β, but high values from 70 to 100 were obtained for the current gain. On the other hand, the current gain β was no greater than 10 when the HBT elements were formed by forming the same HBT element structures over the entire surface of the Si wafer.

Therefore, it is understood that a device with favorable electrical characteristics can be manufactured by forming the HBT element structures locally on the top surface of the Si wafer. It is understood that a device with particularly good electrical characteristics can be manufactured when a side of the top shape of the Ge layer is no greater than 80 μm or when the area of the top surface of the Ge layer is no greater than 1600 μm².

Based on FIG. 22, it is understood that the variation in the ratio of the current gain β to the base sheet resistance value $R_b$ is smaller when the area of the top surface of the Ge layer is 900 μm² or less, than when the area of the top surface of the Ge layer is 1600 μm² or more. Therefore, it is understood that the device described above can be manufactured with good yield when length of a side of the top shape of the Ge layer is no greater than 40 μm or when the area of the top surface of the Ge layer is no greater than 900 μm².

Figure 23:
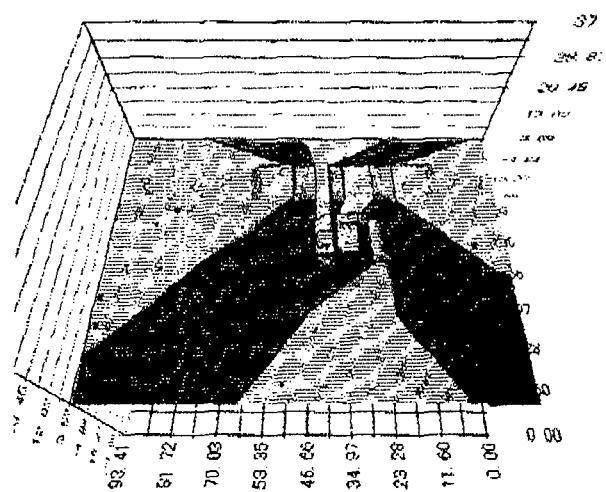
FIG. 23 shows a laser microscope image of an HBT element.

FIG. 23 shows a laser microscope image of a manufactured HBT element. In FIG. 23, the light gray portions represent the electrodes. Based on FIG. 23, it is understood that three electrodes are lined up in the open region arranged near the center of the square covering region. The three electrodes are respectively, in order from the left side of FIG. 23, a base electrode, an emitter electrode, and a collector electrode of the HBT element. Upon measuring the electrical characteristics of this HBT element, it was confirmed that operation as a transistor was possible. Furthermore, upon observing a cross-section of the HBT element with a transmission electron microscope, no dislocation was seen.

Sixth Embodiment

In the same manner as the Fifth Embodiment, three HBT elements having the same structure as the HBT element of the Fifth Embodiment were manufactured. The three manufactured HBT elements were connected in parallel to form an electronic element. In the present embodiment, the planar shape of each $SiO_2$ layer was a rectangle in which a long side had a length of 100 μm and a short side had a length of 50 μm. Three openings were formed within these $SiO_2$ layers. The bottom shape of each opening was a square in which a side is 15 μm. Other conditions were the same as those used when manufacturing the semiconductor wafer of the Fifth Embodiment.

Figure 24:
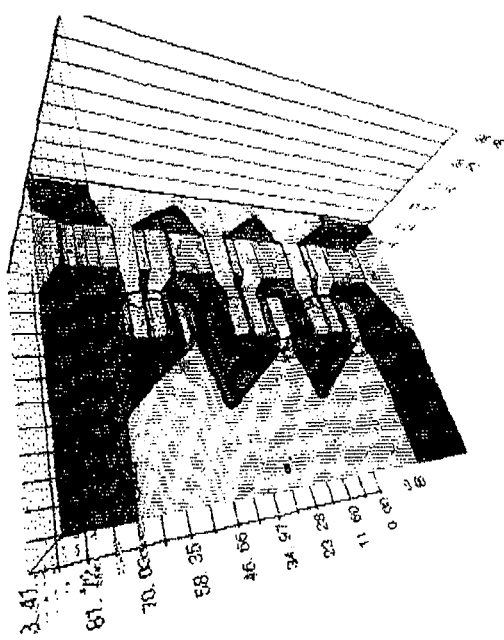
FIG. 24 shows a laser microscope image of the electronic element including three HBT elements.

FIG. 24 shows a laser microscope image of the resulting electronic element. In FIG. 24, the light gray portions represent the electrodes. Based on FIG. 24, it is understood that the three HBT elements are connected in parallel. Upon measuring the electrical characteristics of this electronic element, it was confirmed that operation as a transistor was possible.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

INDUSTRIAL APPLICABILITY

A crystal thin film with good crystallinity can be formed on an inexpensive silicon wafer, and this crystal thin film can be used to form a semiconductor wafer, an electronic device, or the like.

The invention claimed is:

1. A semiconductor wafer comprising:
   an Si wafer;
   a Ge layer that is crystal-grown on the wafer and shaped as an isolated island;
   a buffer layer that is crystal-grown on the Ge layer and is a group 3-5 compound semiconductor layer containing phosphorus; and
   a functional layer that is crystal-grown on the buffer layer.

2. The semiconductor wafer according to claim 1, wherein the Ge layer is shaped as an island having a size that does not exceed double a distance moved by crystal defects as a result of annealing the Ge layer at a certain temperature for a certain time.

3. The semiconductor wafer according to claim 1, wherein the Ge layer is shaped as an island having a size for which stress due to a difference relative to a thermal expansion coefficient of Si, which is material of the wafer, does not cause crystal defects when the Ge layer is annealed at a certain temperature.

4. The semiconductor wafer according to claim 1, wherein the Ge layer is shaped as an island with an area no greater than 1 mm$^2$.

5. The semiconductor wafer according to claim 1, wherein the Ge layer is annealed with a temperature and duration that enables crystal defects to move.

6. The semiconductor wafer according to claim 5, wherein the annealing is repeated a plurality of times.

7. The semiconductor wafer according to claim 1, wherein the functional layer is a group 3-5 compound layer or a group 2-6 compound layer that lattice matches or pseudo-lattice matches with Ge.

8. The semiconductor wafer according to claim 1, wherein the functional layer is a group 3-5 compound layer that lattice matches or pseudo-lattice matches with Ge, in which a group 3 element includes at least one of Al, Ga, and In and a group 5 element includes at least one of N, P, As, and Sb.

9. A semiconductor wafer comprising:
   an Si wafer;
   a plurality of Ge layers formed on the wafer and separated from each other;
   buffer layers formed on the Ge layers; and
   functional layers formed on the buffer layers.

10. The semiconductor wafer according to claim 9, wherein
    the buffer layers lattice match or pseudo-lattice match with the Ge layers, and
    the functional layers lattice match or pseudo-lattice match with the buffer layers.

11. The semiconductor wafer according to claim 9, wherein
    the buffer layers are group 3-5 compound semiconductor layers containing phosphorus.

12. The semiconductor wafer according to claim 9, wherein
    the Ge layers are annealed in an atmosphere containing hydrogen.

13. The semiconductor wafer according to claim 9, wherein
    a surface of each Ge layer facing a functional layer is surface processed with a gas containing phosphorus.

14. The semiconductor wafer according to claim 9, wherein
    area of a top surface of each Ge layer is no greater than 1 mm$^2$.

15. The semiconductor wafer according to claim 14, wherein
    the area of the top surface of each Ge layer is no greater than 1600 µm$^2$.

16. The semiconductor wafer according to claim 15, wherein
    the area of the top surface of each Ge layer is no greater than 900 µm$^2$.

17. The semiconductor wafer according to claim 14, wherein
    the top surface of each Ge layer is shaped as a rectangle, and
    a long side of the rectangle is no greater than 80 µm.

18. The semiconductor wafer according to claim 17, wherein
    the long side of the rectangle is no greater than 40 µm.

19. The semiconductor wafer according to claim 9, wherein
    a principal surface of the wafer is a (100) surface,
    a top surface of each Ge layer is shaped as a square or a rectangle, and
    at least one side of the square or the rectangle is substantially parallel to a direction selected from a group including a <010> direction, a <0-10> direction, a <001> direction, and a <00-1> direction on the principal surface.

20. The semiconductor wafer according to claim 9, wherein
    a principal surface of the wafer is a (111) surface,
    a top surface of each Ge layer is shaped as a hexagon, and
    at least one side of the hexagon is substantially parallel to a direction selected from a group including a <1-10> direction, a <-110> direction, a <0-11> direction, a <01-1> direction, a <10-1> direction, and a <-101> direction on the principal surface.

21. The semiconductor wafer according to claim 9, wherein
    the functional layers are group 3-5 compound layers or group 2-6 compound layers.

22. The semiconductor wafer according to claim 9, wherein
    each functional layer is a group 3-5 compound layer that includes at least one element selected from a group including Al, Ga, and In as a group 3 element and includes at least one element selected from a group including N, P, As, and Sb as a group 5 element.

23. The semiconductor wafer according to claim 22, wherein
    arithmetic mean roughness of each functional layer is no greater than 0.02 µm.

24. A method of manufacturing a semiconductor wafer comprising:
    crystal-growing a Ge layer on an Si wafer;
    patterning the Ge layer to shape the Ge layer as an isolated island;
    crystal-growing, on the Ge layer, a buffer layer that is a group 3-5 compound semiconductor layer containing phosphorus; and
    crystal-growing a functional layer on the buffer layer.

25. The method of manufacturing a semiconductor wafer according to claim 24, further comprising annealing the island-shaped Ge layer with a temperature and duration that enables crystal defects to move.

26. The method of manufacturing a semiconductor wafer according to claim 25, wherein
    the annealing is performed a plurality of times.

27. A method of manufacturing a semiconductor wafer comprising:
- forming a plurality of Ge layers that are separated from each other on an Si wafer;
- forming buffer layers on the Ge layers; and
- forming functional layers on the buffer layers.

28. The method of manufacturing a semiconductor wafer according to claim 27, wherein
- forming the buffer layers includes lattice matching or pseudo-lattice matching the buffer layers with the Ge layers, and
- forming the functional layers includes lattice matching or pseudo-lattice matching the functional layers with the buffer layers.

29. The method of manufacturing a semiconductor wafer according to claim 27, wherein
- forming the buffer layers includes forming group 3-5 compound semiconductor layers containing phosphorus.

30. The method of manufacturing a semiconductor wafer according to claim 27, further comprising annealing the Ge layers with a temperature and duration that enables crystal defects to move.

31. The method of manufacturing a semiconductor wafer according to claim 30, wherein
- the annealing includes annealing the Ge layers at a temperature that is greater than or equal to 680° C. and less than 900° C.

32. The method of manufacturing a semiconductor wafer according to claim 30, wherein
- the annealing includes annealing the Ge layers in an atmosphere containing hydrogen.

33. The method of manufacturing a semiconductor wafer according to claim 30, wherein
- the annealing is performed a plurality of times.

34. The method of manufacturing a semiconductor wafer according to claim 27, wherein
- each functional layer is a group 3-5 compound layer that includes at least one element selected from a group including Al, Ga, and In as a group 3 element and includes at least one element selected from a group including N, P, As, and Sb as a group 5 element, and
- forming the functional layers includes crystal-growing the functional layers at a growth rate no less than 1 nm/min and no greater than 300 nm/min.

35. An electronic device comprising:
- an Si wafer;
- a Ge layer that is crystal-grown on the wafer and shaped as an isolated island;
- a buffer layer that is crystal-grown on the Ge layer and is a group 3-5 compound semiconductor layer containing phosphorus;
- a functional layer that is crystal-grown on the buffer layer; and
- an electronic element formed on the functional layer.

36. The electronic device according to claim 35, wherein one electronic element is formed on each island-shaped Ge layer.

37. The electronic device according to claim 35, wherein a plurality of the island-shaped Ge layers are formed at uniform intervals on the wafer.

38. The electronic device according to claim 35, wherein the electronic elements are heterojunction bipolar transistors.

39. The electronic device according to claim 35, wherein the electronic elements are connected to each other.

40. The electronic device according to claim 35, wherein the electronic elements are connected in parallel.

41. An electronic device comprising:
- an Si wafer;
- a plurality of Ge layers formed on the wafer and separated from each other;
- buffer layers formed on the Ge layers;
- functional layers formed on the buffer layers; and
- electronic elements formed on the functional layers.

42. The electronic device according to claim 41, wherein
- the buffer layers lattice match or pseudo-lattice match with the Ge layers; and
- the functional layers lattice match or pseudo-lattice match with the buffer layers.

43. The electronic device according to claim 41, wherein the buffer layers are group 3-5 compound semiconductor layers containing phosphorus.

44. The electronic device according to claim 41, wherein one electronic element is formed on each Ge layer.

45. The electronic device according to claim 41, wherein the Ge layers are arranged at uniform intervals.

* * * * *